United States Patent [19]

Itoh et al.

[11] 4,376,174
[45] Mar. 8, 1983

[54] CURABLE EPOXY RESIN COMPOSITIONS

[75] Inventors: Kunio Itoh; Tooru Takamura, both of Annaka, Japan

[73] Assignee: Shin-Etsu Chemical Co., Ltd., Tokyo, Japan

[21] Appl. No.: 243,252

[22] Filed: Mar. 12, 1981

[30] Foreign Application Priority Data

Mar. 17, 1980 [JP] Japan .................................. 55-33601

[51] Int. Cl.$^3$ ............................................. C08L 63/00
[52] U.S. Cl. .................................... 523/456; 523/400
[58] Field of Search ................... 260/37 EP; 523/400, 523/456

[56] References Cited

U.S. PATENT DOCUMENTS

| | | | |
|---|---|---|---|
| 3,838,094 | 9/1974 | Sporck | 260/37 EP |
| 3,843,577 | 10/1974 | Keil | 260/37 EP |
| 3,926,885 | 12/1975 | Keil | 260/37 EP |
| 4,082,719 | 4/1978 | Liles et al. | 260/37 EP |
| 4,271,061 | 6/1981 | Suzuki et al. | 260/37 EP |

Primary Examiner—Lewis T. Jacobs
Attorney, Agent, or Firm—Toren, McGeady and Stanger

[57] ABSTRACT

The invention provides a novel curable epoxy resin composition suitable for resin encapsulation of various electronic devices such as transistors, ICs, LSIs and the like with high anti-moisture resistance and without causing excessive stress upon curing to the electronic devices. The resin composition comprises an epoxy resin, a curing agent such as a phenol novolac resin, a filler and a curing catalyst such as an imidazole compound as well as an organosilicon polymer represented by the general formula

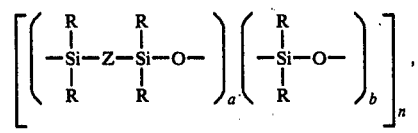

in which R is a monovalent hydrocarbon group such as methyl, Z is a divalent organic group such as ethylene and phenylene, n is a positive number of at least 10 on an average and a and b are each zero or a positive number not exceeding 1 with the proviso that a+b is in the range from 1 to 2 inclusive, in a limited amount.

5 Claims, No Drawings

CURABLE EPOXY RESIN COMPOSITIONS

BACKGROUND OF THE INVENTION

The present invention relates to a novel curable epoxy resin composition or, more particularly, to a curable epoxy resin composition suitable for use in the resin encapsulation of various electric or electronic parts.

As is well known, many of electric parts and electronic devices are used as encapsulated with a synthetic resin. Curable epoxy resins belong to one of the most important classes of the resins for such an application including encapsulation of not only transistors and diodes but also more delicate electronic devices such as ICs and LSIs by virtue of the excellent properties of the cured epoxy resins as well as the good moldability thereof in shaping by the techniques of transfer molding, injection molding and the like.

These epoxy resin compositions, however, still have several problems desirably to be solved. They are, for example, as follows.

(1) The electric or electronic parts encapsulated with a cured resin composition are unavoidably under the influence of the stress produced in the resin composition by the curing thereof leading to eventual distortion or, in sometimes, breaking of the parts. In particular, this problem is more serious in the ICs and LSIs of recent years becoming larger and larger in size with increasing degree of integration so that they are frequently fractured as a consequence of the excessively increased strain.

(2) Attempts have been made to decrease the stress in the cured epoxy resin composition by formulating the resin composition with a different kind of a resin having larger flexibility or with a fribrous material or increasing or by increasing the amount of the inorganic filler. These methods are not without their own respective drawbacks despite the decrease of the stress caused by curing of the resin. For example, formulation of a flexible resin results in decreased anti-moisture resistance of the resin encapsulation along with a lowered glass transition temperature of the resin. Formulation of a fibrous material is undesirable due to the remarkably increased bending of the very fine wires of gold, aluminum and the like used for wiring between the chip and the outer lead wires resulting in frequent wire breaking. Further, a resin composition formulated with an increased amount of an inorganic filler has poor flowing characteristics so that difficulties are encountered in the encapsulation with the resin composition by transfer molding, injection molding and the like molding method so that the stress in the cured resin composition is not decreased as desired.

Accordingly, there has long been desired to develop a novel and improved curable epoxy resin composition which can satisfy the requirement of low stress after curing in the resin encapsulation of ICs and LSIs of large size and with high degree of integration and can be free from the lowering of the glass transition temperature and decrease in the anti-moisture resistance of the resin-encapsulated electronic devices.

SUMMARY OF THE INVENTION

The curable epoxy resin composition of the present invention, which can well satisfy the above mentioned requirement for a composition of resin encapsulation, comprises (a) 100 parts by weight of an epoxy resin,
(b) from 1 to 200 parts by weight of a curing agent,
(c) an organosilicon polymer represented by the general formula

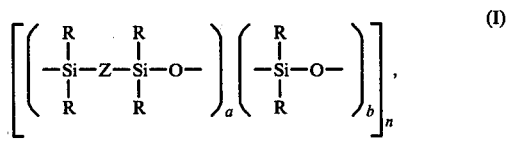

in which each of R is independently a monovalent hydrocarbon group or a halogenated monovalent hydrocarbon group, Z is a divalent organic group, n is an averaged number of at least 10 and a and b each zero or a positive number not exceeding 1 with the proviso that a+b is a positive number from 1 to 2 inclusive, in an amount of from 1 to 50% by weight based on the total amount of the components (a) and (b),
(d) a filler, and
(e) a curing catalyst.

DETAILED DESCRIPTION OF THE PREFERRED EMBODIMENTS

As is described above, the essential ingredients comprised in the curable epoxy resin composition of the invention are the components (a) to (e), which are described and defined in detail in the following.

In the first place, the base ingredient as the component (a) is an epoxy resin which is not particularly limitative in respect of the molecular structure and molecular weight provided that it is a compound having at least two epoxy group in a molecule. Several of the examples of the epoxy resin suitable in the invention are: diglycidyl ether of 2,2-bis(4-hydroxyphenyl)propane and halogenated compounds thereof; butadiene diepoxide; vinylcyclohexene dioxide; diglycidyl ether of resorcin; 1-4-bis(2,3-epoxypropoxy)benzene; 4,4'-bis(2,3-epoxypropoxy) diphenyl ether; 1,4-bis(2,3-epoxypropoxy)cyclohexene; bis(3,4-epoxy-6-methylcyclohexyl-methyl) adipate; polyglycidyl ethers and polyglycidyl esters as a condensation product of catechol, resorcin, polyvalent phenol or polyvalent alcohol with epichlorohydrin; epoxy novelacs as a condensation product of a novolac type phenolic resin or halogenated product thereof with epichlorohydrin; epoxidated polyolefins obtained by the peroxidation method; epoxidated polybutadienes and the like.

It is optional that a small amount of a monoepoxy compound is used in combination with the above described epoxy resins as the component (a). Examples of the monoepoxy compounds are: styrene oxide; cyclohexene oxide; propylene oxide; methyl glycidyl ether; ethyl glycidyl ether; phenyl glycidyl ether; allyl glycidyl ether; octylene oxide; dodecene oxide and the like.

The above named epoxy resin compounds may be used either alone or as a combination of two kinds or more according to need.

Next comes the curing agent as the component (b). Curing agent for an epoxy resin are well known in the art as exemplified by amine compounds such as diethylene triamine; triethylene tetramine; diethylaminopropyl-amine; N-aminoethylpiperazine; bis(4-amino-3-methylcyclohexyl) methane; m-xylylene diamine; menthane diamine; 3,9-bis(3-aminopropyl)-2,4,8,10-tetraoxaspiso(5,5)undecane and the like; modified aliphatic polyamines; amine-ethylene oxide adducts; cyanoethylated polyamines and the like; bisphenol A; trimethylol allyloxyphenol; phenolic resins such as phenol novolac resins of low degree of polymerization; butylated phenolic resins; commercially available phenolic resins sold under various tradenames such as Super Beckacite 1001 (a product by Nippon Reichhold Kagaku Kogyo Co.); Hitanol 4010 (a product by Hitachi Seisakusho); Scadoform L 9 (a product by Scado Zwoll Co.); Methylon 75108 (a product by General Electric Co.) and the like; urea resins sold tradename of Beckamine P 138 (a product by Nippon Reichhold Co.) U-Van 10R (a product by Mitsui Toatsu Chemical Co.) and the like; amino resins including melamine resins, aniline resins and the like; polysulfide resins having at least two mercapto groups in a molecule as expressed by the formula

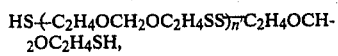

where n' is an integer from 1 to 10 inclusive; organic acids and anhydrides thereof such as phthalic anhydride; hexahydrophthalic anhydride; tetrahydrophthalic anhydride; pyromellitic anhydride; methylnadic acid; dodecyl succinic anhydride; chlorendic anhydride and the like.

Among the above named compounds suitable as the curing agent, phenolic resins or phenol novolac resins are particularly preferable since the epoxy resin compositions formulated with these phenolic or phenol novolac resins exhibit good moldability in transfer molding or injection molding and the encapsulated electronic devices such as ICs and LSIc obtained with the resin composition are imparted with excellent anti-moisture resistance in addition to the safety by the absence of toxicity and relative inexpensiveness.

The above mentioned curing agents may be used either alone or as a combination of two kinds or more according to need.

The amount of this component (b) to be formulated in the inventive resin composition naturally depends widely on the kind thereof but it is usually in the range from 1 to 200 parts by weight or, preferable, from 5 to 100 parts by weight per 100 parts by weight of the component (a). When the amount is smaller than 1 part by weight, the resin composition cannot be cured satisfactorily while an excessive amount of the component (b) over 200 parts by weight results in the disadvantages that the relatively expensive component (c) described below must be used in a correspondingly large amount and that an unduly long time is required for curing of the resin composition due to the dilution of the component (a) along with decreased properties of the cured products.

The most characteristic ingredient in the inventive resin composition is the component (c) which is an organosilicon compound represented by the above given general formula (I). This component is indispensable in the inventive resin composition in order that the desired effects of low stress by curing as well as the excellent anti-moisture resistance of the cured products can be fully achieved.

In the formula (I), R denotes the same or different monovalent hydrocarbon group exemplified by alkyl groups such as methyl, ethyl and propyl groups, alkenyl groups such as vinyl and allyl groups, aryl groups such as phenyl group, cycloalkyl groups such as cyclohexyl groups and aralkyl groups such as phenylethyl group as well as those groups obtained by the substitution of halogen atoms for part or all of the hydrogen atoms in the above named hydrocarbon groups.

The symbol Z in the formula (I) denoted a divalent organic group exemplified by alkylene groups having from 1 to 10 carbon atoms such as methylene, ethylene and propylene groups, arylene groups such as p-phenylene group, 4,4'-biphenylene group, 4,4'-diphenylene ether group, 4,4'-dimethylenebenzene group, 4,4'-dimethylenediphenyl ether group and the like.

The symbols a and b in the formula (I) each denote a number from 0 to 1 inclusive with the proviso that a+b is in the range from 1 to 2. The symbol n denoted the degree of polymerization of the organosilicon compound and should be at least 10 on an average. When the organosilicon compound as the component (c) has a relatively small molecular weight with the value of n being smaller than 10, the appearance of the cured resin composition used in the resin encapsulation of electronic devices is less pleasant due to the increased volatility of the organosilicon compound.

The organosilicon polymer as the component (c) may be composed of the monomeric units of

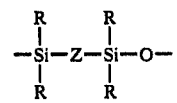

alone, the monomeric units of

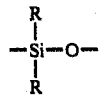

alone or a combination of both. It is preferable that the molar ratio of a/b is in the range from 0.2 to 1.0 inclusive.

The terminal groups at the molecular chain ends of the organosilicon polymer of the general formula (I) are not particularly limitative including hydroxy, alkoxy, alkyl and aryl groups among which hydroxy groups are preferred.

The organosilicon polymer of the general formula (I) in which b is 1 and n is at least 10 is described in scientific article appearing in "Journal of Polymer Science" Part A, volume 2, pages 31–44 and volume 11, pages 319–326.

The organosilicon polymer in conformity with the general formula (I) may be used either alone or as a combination of two kinds or more according to need.

The amount of the component (c) to be formulated in the inventive resin composition is in the range from 1 to 50% by weight or, preferable, from 5 to 40% by weight based on the total amount of the above described components (a) and (b). This is because the desired effect of decreased stress in the cured products cannot be obtained with a smaller amount of the component than above while an excessively large amount of the component results in inferior mechanical strengths of the cured products.

The filler as the component (d) is an organic or inorganic fine particulate or fibrous material and various kinds of known ones may be used. Several of the examples are: mica powder, finely divided silica, powder of fused quartz, bauxite, river sand, titanium dioxide, calcium carbonate, powdered slate, antimony trioxide, barium sulfate, clay, talc, powdered synthetic resin, glass fiber, glass wool, rock wool, synthetic resin fiber and carbon black though not limited thereto. They may be used either alone or as a combination of two kinds or more according to need.

When the filler material is inorganic, in particular, it is sometimes advantageous to use a silane coupling agent or other processing aid in order to improve the adhesion between the epoxy resin and the surface of the inorganic filler. The use of such a processing aid is in general not detrimental to the object of the present invention.

Suitable amount of the filler as the component (d) in the inventive resin composition naturally depends on the kind thereof but usually it is in the range from about 50 to 600 parts by weight per 100 parts by weight of the total amount of the components (a) and (b).

The last of the essential ingredients in the inventive resin composition is the curing catalyst as the component (e). Various kinds of known ones conventionally used in the curing of the epoxy compounds may be used as the component (e) in the invention including imidazole compounds such as imidazole, 2-methylimidazole, 2-ethylimidazole, 2,4-dimethylimidazole, 2-ethyl-4-methylimidazole, 2-un-decylimidazole, 2-heptadecylimidazole, 1-vinyl-2-methylimidazole, 2-phenyl-4,5-dihydroxymethylimidazole, 2-phenylimidazole and 2-phenyl-4-methylimidazole, amine compounds such as triethylamine, ethylenediamine, piperazine, piperidine, pyrrolidine, morpholine, 1,5-diazabicyclo(3,4,0)nonene-5 and 1,8-diaza-bicyclo(5,4,0)undecene-7, boron trifluoride-triethylamine adduct, triphenylphosphine, tetra-substituted phosphonium tetra-substituted borate and thiazole compounds.

The above named curing catalysts as the component (e) may be used either singly or as a combination of two kinds or more in accordance with the respective performance of the individual compounds. The amount of the curing catalyst is naturally determined in accordance with the desired curing velocity.

The curable epoxy resin composition of the present invention is readily obtained by blending the components (a) to (e) together with other optional additive ingredients uniformly in a blending machine which may be a conventional one used in the preparation of thermosetting resin compositions such as roller mills, kneaders and the like. The sequential order of addition of the individual components in the blending and the manner of blending are not particularly limitative. For example, the organosilicon polymer as the component (c) may be incorporated into the resin composition by blending together with the epoxy resin and other components at a time by roll milling.

In the following, the curable epoxy resin compositions of the present invention are further described in detail by way of examples. In the examples, the epoxy resin compositions as well as the cured products obtained therefrom were evaluated by the testing procedures described below.

Flowability of the resin composition by the spiral flow test: the measurement was conducted by use of a metal mold specified in the EMMI Specification at a molding temperature of 160° C. and under a molding pressure of 70 Kg/cm².

Flexural strength of cured products: a red specimen of 10 mm×100 mm×4 mm was prepared according to JIS K 6911 under conditions of the molding temperature at 160° C., molding pressure of 70 Kg/cm² and molding time of 3 minutes followed by post-curing at 180° C. for 4 hours and measurement was conducted according to the JIS procedure.

Coefficient of expansion: measurement was conducted according to ASTM D 696 with the rod specimen prepared for the measurement of the flexural strength described above.

Stress in the cured resin composition: a piezoelectric resistance material having stress-sensitive resistivity was shaped into a 3 mm×3 mm square chip and the chip was die-bonded to a 14-pin frame for IC with wire-bonding with gold wires and connected to external electrodes to give a test element. After measurement of the resistance $R_o$ of the above element, it was encapsulated with the resin composition under testing at a molding temperature of 160° C. under a molding pressure of 70 Kg/cm² for 3 minutes to give a value of the resistance R under stress. The ratio of the increase of the resistance $R-R_o$ by the stress to the stress-fee value $R_o$, i.e. $(R-R_o)/R_o$, was taken as a measure of the stress in the cured resin composition.

Water absorption: a disc-like specimen of 2 mm thickness and 70 mm diameter prepared with the resin composition under conditions of the molding temperature at 160° C., molding pressure of 70 Kg/cm² and molding time of 3 minutes followed by post-curing at 180° C. for 4 hours was used as the test specimen which was subjected to the pressure-hooker test at 121° C. and under 2 atmospheres for 100 hours and the weight increase was taken as the water absorption.

Glass transition temperature: a small square rod of 5 mm×5 mm×20 mm was prepared by cutting the rod obtained in the same procedure as in the specimen for the measurement of the flexural strength and the inflection point in the temperature-expansion curve was determined dilatometrically at a rate of temperature elevation of 5° C./minute and taken as the glass transition temperature of the cured resin composition.

EXAMPLE 1

A reaction mixture in a flask composed of 113 g of 1,4-bis(dimethylhydroxysilyl)benzene, 280 ml of toluene and 100 g of dimethyl di(2-aminoethyl)silane was heated under reflux for 1 hour and toluene and the ethylamine formed by the reaction were removed by distilling off in an atmosphere of nitrogen.

Into the above reaction mixture kept at 80° C. was added each 0.2 ml portion of dimethyl di(2-aminoethyl)-silane in 5 portions in every 5 minutes with the stirrer driven and, when the reaction mixture began to wind up around the stirrer by the increase of the viscosity, 50 ml of toluene were added to dissolve the reaction mixture. With addition of 50 ml of water, the reaction mixture was heated for 1 hour under reflux, washed with methyl alcohol and stripped of the volatile matter to give an organosilicon polymer expressed by the following formula, in which, and hereinafter, Me denotes a methyl group.

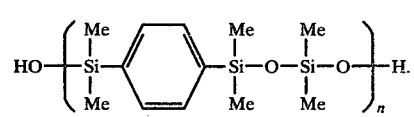

The thus obtained organosilicon polymer had a specific viscosity of 2,3 as measured at 25° C. in a tetrahydrofuran solution of a concentration of 1 g/100 ml. This product is called organosilicon polymer A hereinafter.

Five kinds of epoxy resin compositions were prepared in formulations of each with 67 parts by weight of a cresol novolac epoxy resin having an epoxy equivalent of 220, 33 parts by weight of a phenol novolac resin having a phenol equivalent of 110, 0.6 part by weight of 2-phenylimidazole, 1.5 parts by weight of carnauba wax and 0.5 part by weight of carbon black together with varied amounts of the organosilicon polymer A and a powder of fused quartz indicated in Table 1 below by uniformly blending in a roller mill at 80° to 90° C. for 10 minutes followed by cooling and crushing.

Flowability and other properties of these resin compositions were examined in the manner described above to give the results shown in Table 1. Composition No. 1 in the table was prepared for comparative purpose with a deficient amount of the organosilicon polymer A.

In the next place, these resin compositions were subjected to the test for anti-crack resistance in a manner as described below.

That is, each of the resin compositions was molded in a metal mold for a block of 8 mm diameter and 15 mm length with a steatite-made insulator of 5.5 mm diameter and 10 mm length inserted thereinto under molding conditions of a temperature at 160° C., with a molding pressure of 70 kg/cm² and molding time of 2 minutes followed by post-curing at 180° C. for 4 hours. Twenty pieces of the above test specimens were prepared with each of the resin compositions. These test specimens were subjected to repeated cycles of chilling and heating, each cycle being a sequence of chilling at −55° C. for 20 minutes and heating at 150° C. for 20 minutes. The above chilling-heating cycle was repeated up to 100 cycles and the numbers of test specimens destroyed by cracking among the 20 specimens were recorded to give the results shown in Table 1. As is clear from the results, the organosilicon polymer A is effective in enhancing the anti-crack resistance of the cured articles.

TABLE 1

| Resin composition No. | | 1 | 2 | 3 | 4 | 5 |
|---|---|---|---|---|---|---|
| Organosilicon polymer A taken, parts by weight | | 0.5 | 1 | 10 | 20 | 30 |
| Fused quartz powder taken, parts by weight | | 220 | 222 | 242 | 264 | 286 |
| Spiral flow, inches | | 44 | 45 | 35 | 37 | 33 |
| Flexural strength, kg/mm² | | 14.2 | 14.2 | 13.2 | 12.8 | 8.5 |
| Coefficient of expansion, × 10⁻⁵/°C. | | 2.08 | 2.00 | 1.87 | 1.73 | 1.70 |
| Stress in cured resin, % | | −5.2 | −4.8 | −4.0 | −3.5 | −3.4 |
| Water absorption, % | | 0.91 | 0.91 | 0.87 | 0.84 | 0.82 |
| Glass transition temperature, °C. | | 162 | 169 | 164 | 167 | 170 |
| Anti-crack resistance, number of cracked specimens | Initial | 0 | 0 | 0 | 0 | 0 |
| | After 1 cycle | 2 | 0 | 0 | 0 | 0 |
| | After 5 cycles | 7 | 1 | 0 | 0 | 0 |
| | After 10 cycles | 8 | 2 | 0 | 0 | 0 |
| | After 20 cycles | 11 | 2 | 0 | 0 | 0 |
| | After 50 cycles | 13 | 4 | 0 | 0 | 0 |
| | After 100 cycles | 15 | 4 | 1 | 0 | 0 |

EXAMPLE 2

A reaction mixture in a flask composed of 45.2 g of 1,4-bis-(dimethylhydroxysilyl)benzene, 30 ml of benzene and 0.1 g of 1,1,3,3-tetramethylguanidine 2-ethylhexoate as a catalyst was heated for 2 hours under reflux followed by stripping off of the benzene to give a white polymeric product. This product had a specific viscosity of 4.2 as measured at 25° C. in a tetrahydrofuran solution of a concentration of 1 g/100 ml and was an organosilicon polymer expressed by the formula

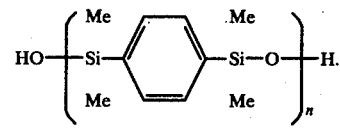

This product is called organosilicon polymer B hereinafter.

Three kinds of epoxy resin compositions were prepared in the same manner as in the preceding example by uniformly blending 67 parts by weight of the cresol novolac epoxy resin, 33 parts by weight of the phenol novolac resin, 220 parts by weight of the fused quartz powder, 0.6 part by weight of 2-phenylimidazol, 1.5 parts by weight of carnauba wax and 0.5 part by weight of carbon black, each of these components being the same one as used in the preceding example, together with each 10 parts by weight the organosilicon polymer B, a dimethylpolysiloxane gum having a specific viscosity of 2.0 as measured at 25° C. in a toluene solution of 1 g/100 ml concentration or a dimethylsilicone fluid having a viscosity of 6000 centistokes at 25° C.

These resin compositions were examined in the same manner as in Example 1 to give the results shown in Table 2 below.

TABLE 2

| Resin composition No. | 6 | 7 | 8 |
|---|---|---|---|
| Organosilicon compound | Organosilicon polymer B | Dimethylsiloxane gum | Dimethylsilicone sluid |
| Spiral flow, inches | 29 | 33 | 35 |
| Flexural strength, kg/mm² | 13.0 | 14.0 | 13.0 |
| Coefficient of expansion, × 10⁻⁵/°C. | 1.85 | 1.90 | 2.10 |
| Stress in cured resin, % | −3.9 | −3.9 | −3.3 |
| Water absorption, % | 0.91 | 0.87 | 0.87 |
| Glass transition temperature, °C. | 162 | 167 | 165 |

What is claimed is:

1. A curable epoxy resin composition which comprises
(a) 100 parts by weight of an epoxy resin,
(b) from 1 to 200 parts by weight of a curing agent,
(c) an organosilicon polymer represented by the general formula

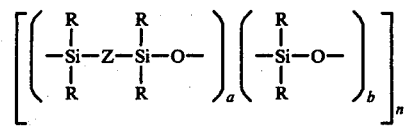

in which
R is independently a monovalent hydrocarbon group or a halogenated monovalent hydrocarbon group,
Z is an alkylene or arylene group,
n is a positive number of at least 10 on an average and a and b are each a positive number not exceeding 1 with the proviso that a+b is a positive number from 1 to 2 inclusive and the ratio of a to b is in the range from 0.2 to 1.0 inclusive,
in an amount of from 1 to 50% by weight based on the total amount of the components (a) and (b),
(d) a filler, and
(e) a curing catalyst.

2. The curable epoxy resin composition as claimed in claim 1 wherein the curing agent is a phenol novolac resin.

3. The curable epoxy resin composition as claimed in claim 1 wherein the terminal groups at the molecular chain ends of the organosilicon polymer are hydroxy groups.

4. The curable epoxy resin composition as claimed in claim 1 wherein the amount of the organosilicon polymer as the component (c) is in the range from 5 to 40% by weight based on the total amount of the component (a) and (b).

5. The curable epoxy resin composition as claimed in claim 1 wherein the amount of the filler as the component (d) is in the range from 50 to 600 parts by weight per 100 parts by weight of the total amount of the components (a) and (b).

* * * * *